（12）United States Patent
Maling et al.

(10) Patent No.: US 9,443,764 B2
(45) Date of Patent: Sep. 13, 2016

(54) METHOD OF ELIMINATING POOR REVEAL OF THROUGH SILICON VIAS

(71) Applicant: GLOBALFOUNDRIES, INC., Grand Cayman (KY)

(72) Inventors: Jeffrey C. Maling, Grand Isle, VT (US); Anthony K. Stamper, Williston, VT (US); Zeljka Topic-Beganovic, Essex Junction, VT (US); Daniel S. Vanslette, Fairfax, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 95 days.

(21) Appl. No.: 14/052,366

(22) Filed: Oct. 11, 2013

(65) Prior Publication Data

US 2015/0101856 A1    Apr. 16, 2015

(51) Int. Cl.
*H01L 21/768* (2006.01)
*H05K 1/11* (2006.01)
*H01L 23/48* (2006.01)

(52) U.S. Cl.
CPC ....... *H01L 21/76898* (2013.01); *H01L 23/481* (2013.01); *H05K 1/115* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,056,813 B2 | 6/2006 | Morrow et al. | |
| 7,199,449 B2 | 4/2007 | Lake | |
| 7,425,499 B2 | 9/2008 | Oliver et al. | |
| 7,935,571 B2 | 5/2011 | Ramiah et al. | |
| 8,035,198 B2 | 10/2011 | Ding et al. | |
| 8,212,331 B1* | 7/2012 | Kar-Roy | H01L 21/6835 257/508 |
| 8,263,497 B2 | 9/2012 | Andry et al. | |
| 8,329,579 B2 | 12/2012 | Sanders et al. | |
| 8,349,734 B2* | 1/2013 | Augur | 438/667 |
| 8,361,828 B1 | 1/2013 | Patterson et al. | |
| 2004/0021139 A1* | 2/2004 | Jackson et al. | 257/40 |
| 2006/0042952 A1 | 3/2006 | Oliver et al. | |
| 2010/0032811 A1 | 2/2010 | Ding et al. | |
| 2010/0178766 A1 | 7/2010 | Andry et al. | |
| 2010/0252934 A1* | 10/2010 | Law | H01L 23/481 257/774 |
| 2013/0168803 A1* | 7/2013 | Haddad | H01L 21/50 257/507 |
| 2013/0299969 A1* | 11/2013 | Kim | H01L 23/3128 257/737 |
| 2014/0035109 A1* | 2/2014 | Volant | H01L 23/481 257/621 |
| 2014/0275911 A1* | 9/2014 | Chen | A61B 5/04001 600/372 |
| 2014/0327105 A1* | 11/2014 | Ramachandran | H01L 27/0814 257/499 |
| 2015/0048496 A1* | 2/2015 | Chiu et al. | 257/737 |

\* cited by examiner

*Primary Examiner* — Michael Jung
(74) *Attorney, Agent, or Firm* — Hoffman Warnick LLC; David Cain

(57) ABSTRACT

A method and structure for eliminating through silicon via poor reveal is disclosed. In one embodiment, the method includes obtaining a wafer having a front side, a back side and partially etched and metalized through silicon vias each extending from a portion of the front side through a portion of the back side, terminating before reaching an end surface of the back side. A region of the back side of the wafer is patterned and etched to expose and reveal a portion of each of the plurality of through silicon vias. A metal layer is deposited on the back side of the wafer to form a back side metallization. The metal layer covers all of the back side including the etched region of the back side and the exposed portions of each of the through silicon vias.

19 Claims, 6 Drawing Sheets

METHOD OF ELIMINATING POOR REVEAL OF THROUGH SILICON VIAS

BACKGROUND

Embodiments of the present invention relate generally to integrated circuit chips, and more specifically, to eliminating poor reveal of through silicon vias (TSVs).

TSVs are generally vertical connections etched through a silicon wafer and filled with metal. With TSVs, two or more vertically stacked chips (or dies) can be joined by vertical interconnects running through the stack and functioning as components of an integrated circuit. Stacking chips in comparison to wire bonding, reduces inductive loses which increases speed of data exchange. Since TSVs have shorter interconnects between the dies, there will be reduced power consumption caused by long horizontal wiring. As a result, TSVs allow much higher input/output density than wire bonding, which consumes much more space.

In this manner, TSVs allow multiple integrated circuit chips to be stacked together, allowing greater amounts of information to be passed between the chips. For example, integrated circuit chips and memory devices which typically reside side-by-side on a silicon wafer, can be stacked on top of another with the advent of the TSVs. Stacking the integrated circuit chips with the memory devices will dramatically reduce the size of the overall chip package and boost speeds at which data flows among the functions on the chip.

After formation of TSVs in a silicon wafer, a back side grind operation is typically performed on the back side of the wafer to reveal the TSVs. Poor reveal of the TSVs can arise due to the vias not being etched deep enough during their formation. That is, if the trenches of the TSVs are not etched deep enough during formation, then when the back side grind operation is performed on the wafer, the TSVs will not be revealed. Poor reveal of TSVs that are not etched enough are problematic because a vertical electrical connection will not be attained. The impact of poor reveal of the TSVs will depend on how much of the wafer has the poor reveal. Typically, poor reveal of TSVs will appear on the edge of the wafer and progress towards the center of the wafer. If the poor reveal is within a wafer pickable area, then the wafer may need to be scrapped.

SUMMARY

In one embodiment, a method is provided. In this embodiment, the method comprises: obtaining a wafer having a front side, a back side and a plurality of partially etched and metalized through silicon vias each extending from a portion of the front side through a portion of the back side, terminating before reaching an end surface of the back side; patterning and etching a region of the back side of the wafer to expose and reveal a portion of each of the plurality of through silicon vias; and depositing a metal layer on the back side of the wafer to form a back side metallization, the metal layer covering all of the back side including the etched region of the back side and the exposed portions of each of the plurality of through silicon vias.

In a second embodiment, a method is provided. In this embodiment, the method comprises: obtaining a wafer having a front side, a back side and a plurality of partially etched and metalized through silicon vias each extending from a portion of the front side through a portion of the back side, terminating before reaching an end surface of the back side; thinning the back side of the wafer to prevent exposure of the metalized through silicon vias at the wafer front side and exposure of a bottom surface of the metalized through silicon vias at the wafer front side; patterning and etching an opening in the back side of the wafer to expose and reveal a trench portion of each of the plurality of through silicon vias; and depositing a metal layer on the back side of the wafer to form a back side metallization, the metal layer extending along a surface of the back side including along the opening and the exposed trench portions of each of the plurality of through silicon vias.

In a third embodiment, a structure is provided. In this embodiment, the structure comprises: a wafer having a front side, a back side and a plurality of partially etched and metalized through silicon vias each extending through the front side to the back side, the back side having an opening formed therein that reveals a portion of a trench associated with each of the plurality of through silicon vias; and a metal layer deposited on the back side of the wafer to form a back side metallization, the metal layer covering all of the back side including along the opening and the exposed portions of each trench associated with the plurality of through silicon vias.

DETAILED DESCRIPTION

Figure 1:
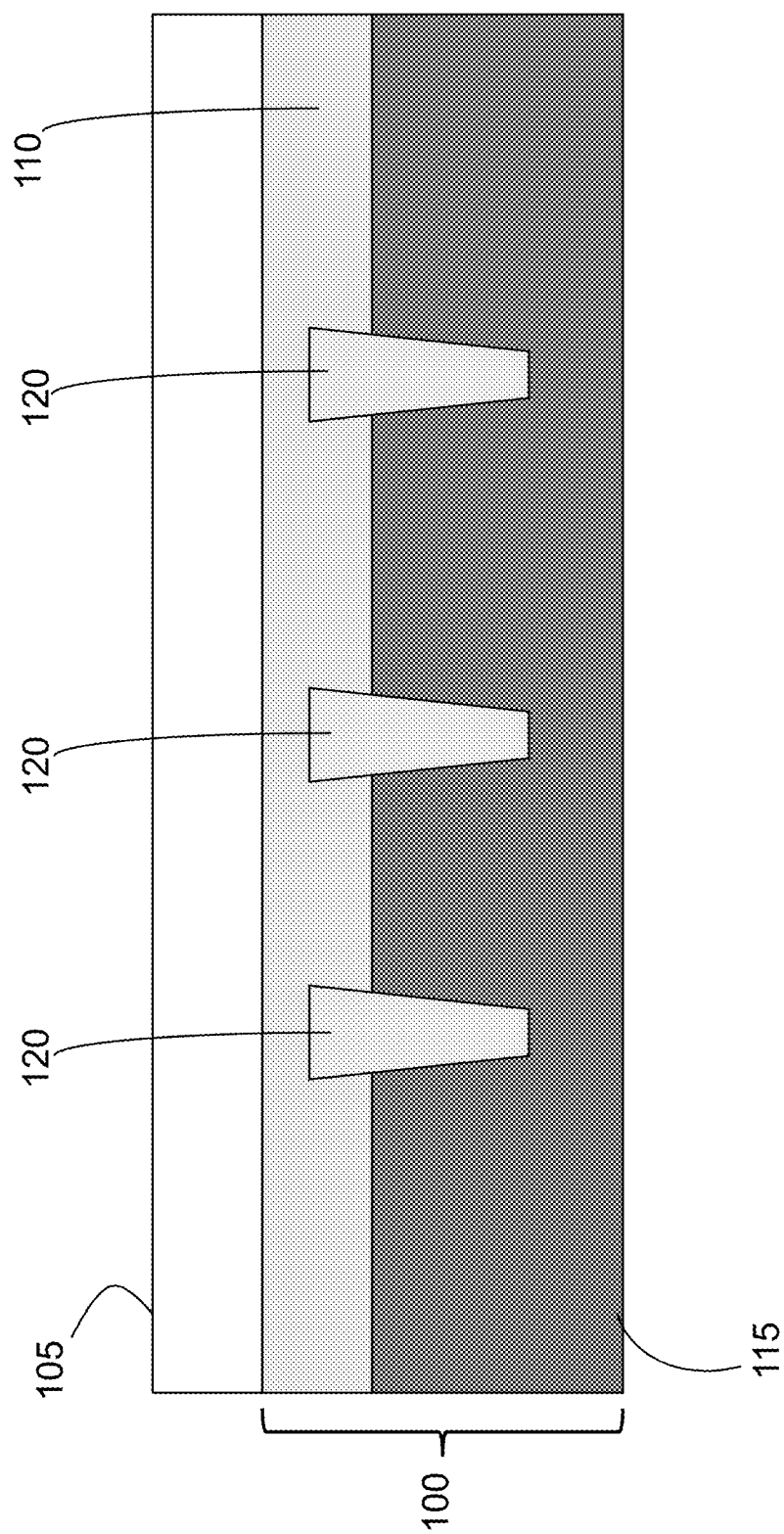
FIGS. 1-3 show a method of forming partial front side through silicon vias (TSVs) according to a first embodiment of the present invention.
Figure 2:
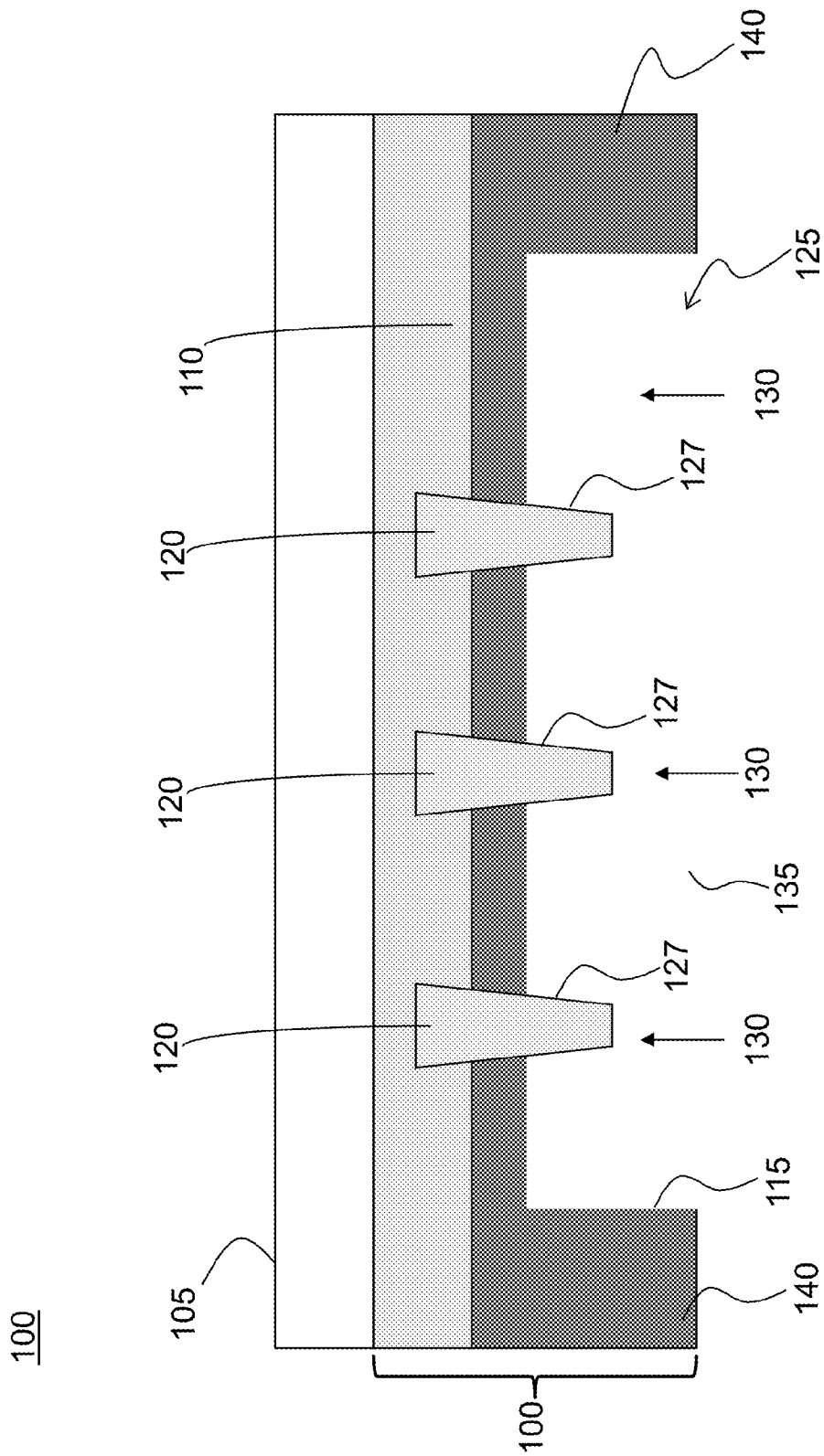
Figure 3:
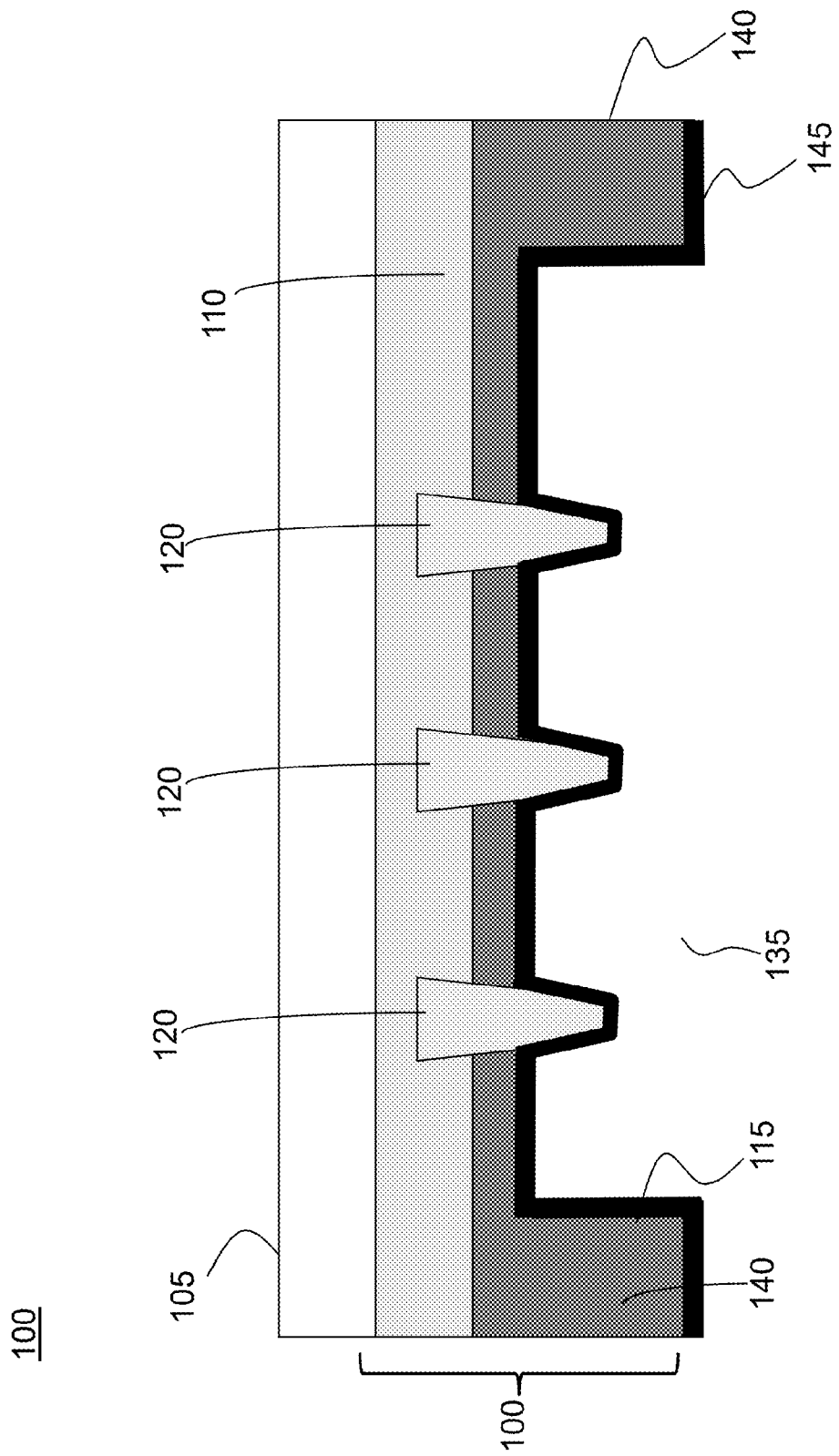

Referring now to the figures, FIGS. 1-3 show a method of forming partial front side through silicon vias (TSVs) according to a first embodiment of the present invention. The method of forming partial front side TSVs according to this embodiment begins at FIG. 1 by obtaining a wafer 100 optionally coupled to a wafer carrier 105. Wafer 100 includes a wafer front side 110, a wafer back side 115 and a plurality of partially etched and metalized TSVs 120 each extending from a portion of the front side through a portion of back side, terminating before reaching an end surface of the back side. In one embodiment, wafer 100 with the partially etched and metalized TSVs 120 can be formed by photolithography, etching (e.g., reactive ion etch (RIE), inductive coupling of RF power etch (ICP)), metal or dielectric and metal deposition, and chemical-mechanical planarization (CMP).

In FIG. 2, a region 125 of wafer back side 115 is lithographically patterned and etched 130 to expose a trench portion 127 of each of the plurality of TSVs 120. In this embodiment, the etching 130 of region 125 of back side 115 comprises etching an area of the back side that encompasses each of the plurality of TSVs 120. Etching 130 region 125 of back side 115 can include applying a plasma etch, a RIE, an anisotropic wet etch, an ICP etch, or an electron cyclotron resonance (ECR) etch as known in the art. In one embodiment, the patterned wafer back side 115 can be etched using xenon difluoride ($XeF_2$) gas. Optionally, the wafer backside can be thinned using standard methods such as backside grind, etch, and/or chemical mechanical polish to a desired thickness which does not reach the bottom of the TSV's 120 before exposing the wafer back side to the patterning and etch step. In this manner, the thinning of back side of the wafer can prevent exposure of the metalized through silicon vias at the wafer front side and exposure of a bottom surface of the metalized through silicon vias at the wafer front side.

In one embodiment, the starting wafer thickness can be approximately 725 microns; the wafer front side TSV's can be etched 80+/−2 microns into the wafer, the wafer back side can be thinned using a back side grind operation and CMP to a thickness of 90+/−4 microns; and the wafer back side post patterning etch depth can be 18+/−1 microns.

In one embodiment, the wafer backside lithographic patterning process used with etching 130 can be precisely aligned to features the wafer frontside TSV's and/or other structures, with a tight registration tolerance, such as +/−5 microns or less.

In one embodiment, the lithographic patterning of back side 115 of wafer 100 can include applying a mask such as a waffle mask pattern to the back side to obtain an opening 135 with no alignment of the waffle mask to features on the wafer front side such as the TSVs. For this embodiment, the waffle mask would only be aligned to the wafer back side features, such as the wafer edge, notch, and/or flat. Since this embodiment does not require alignment to the wafer front side features, it is simpler to implement than the option requiring alignment. For this embodiment, the waffle mask openings would be designed such that they open up all area inside the active chip that has wafer front side metalized TSV's and only the dicing channel regions would not be opened. The waffle mask would have a registration tolerance to wafer front side features on the order of +/−25 to +/−100 microns, and thusly the waffle mask openings would need to be about 25 to about 100 microns wider than the portions of the active chips which have wafer front side metalized TSV's. In one embodiment, an almost full chip RIE or anisotropic etch can be used to obtain opening 135. It is understood that for an RIE etch of a large opening, there will be no RIE lag which results in a faster etch rate. A benefit of using an anisotropic etch to form opening 135 is that it allows for wide, imprecise sidewall edges. The use of the mask and the etching results in revealed TSV s and the formation of rim structures 140 on back side 115, which provides mechanical strength.

In FIG. 3, a metal layer 145 is deposited on back side 115 of wafer 100. Metal layer 145 can cover all of back side 115 including the etched region of the back side and the exposed trench portions 127 (FIG. 2) of each of TSVs 120. In one embodiment, depositing metal layer 145 on back side 115 of wafer 100 can include depositing a deposit of titanium nitride (TiN) layer and a copper (Cu) seed followed by Cu electro plating. It is understood that the front side of the TSVs can have dielectrics and multilevel metallization. In one embodiment, a multilevel front side metallization can include aluminum (Al), Cu, etc. In another embodiment, the multilevel front side metallization can include a hybrid multilevel metallization of Cu and Al wires.

Figure 4:
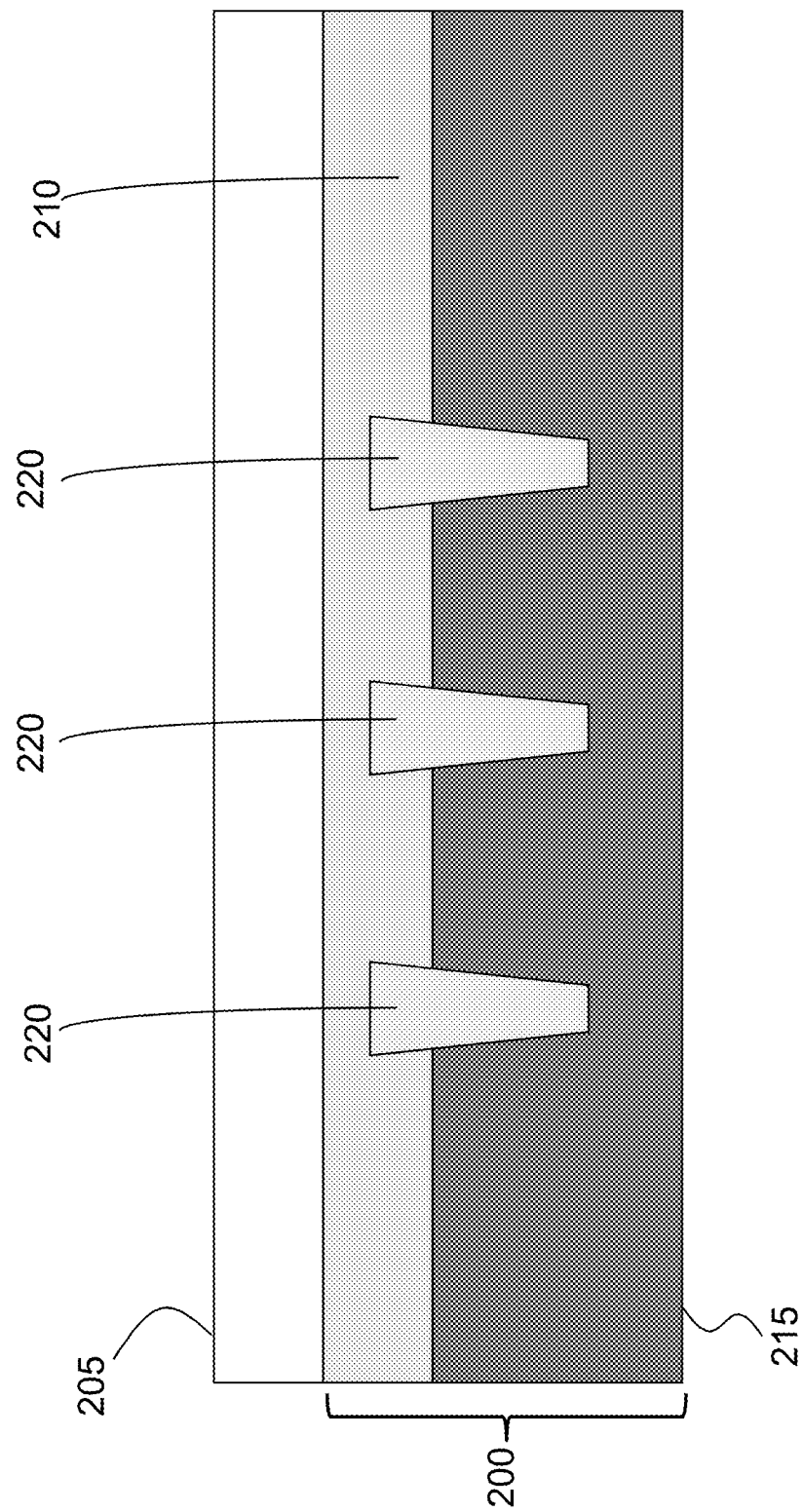
FIGS. 4-6 show a method of forming partial front side through silicon vias (TSVs) according to a second embodiment of the present invention.
Figure 5:
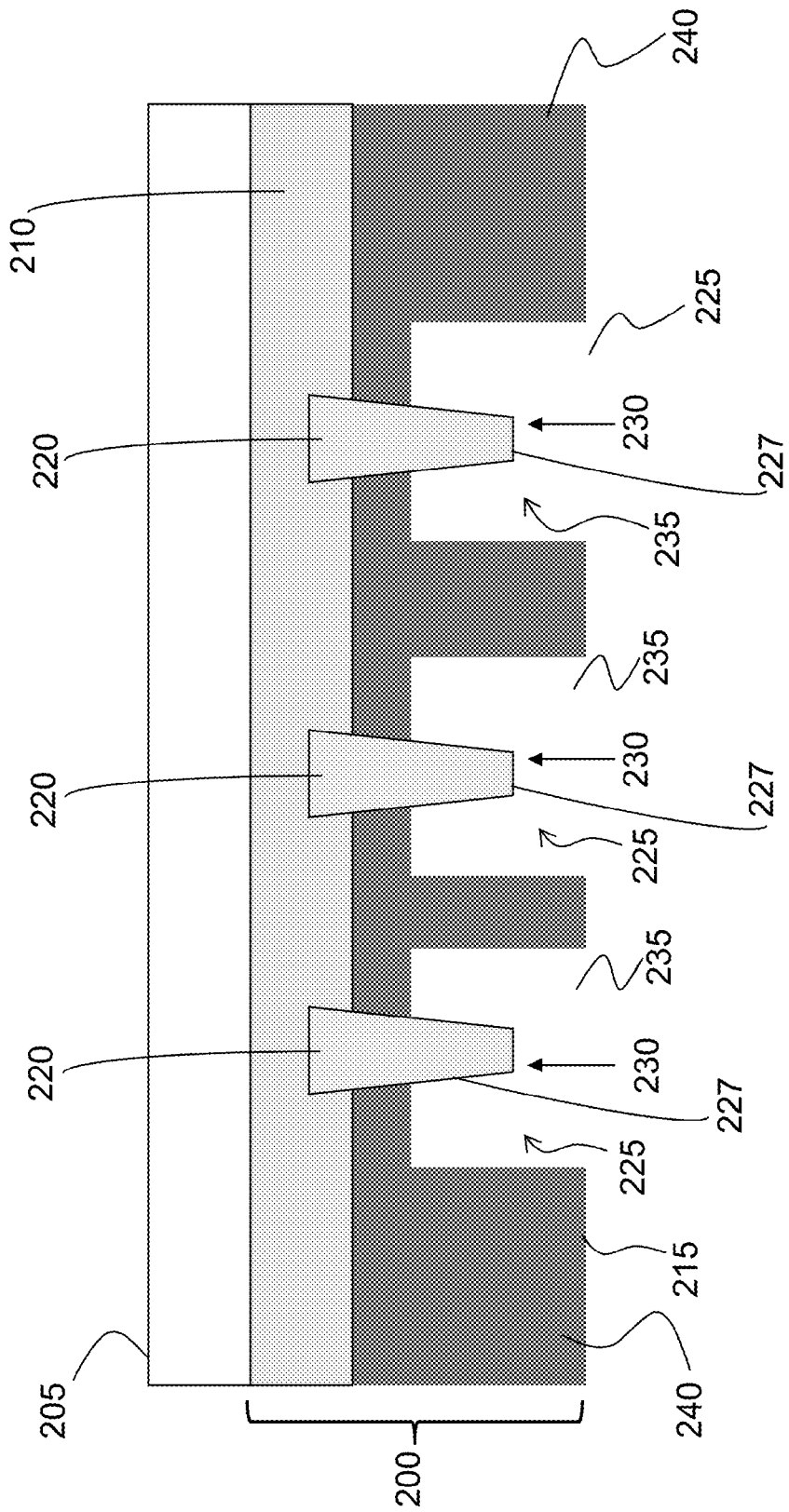
Figure 6:
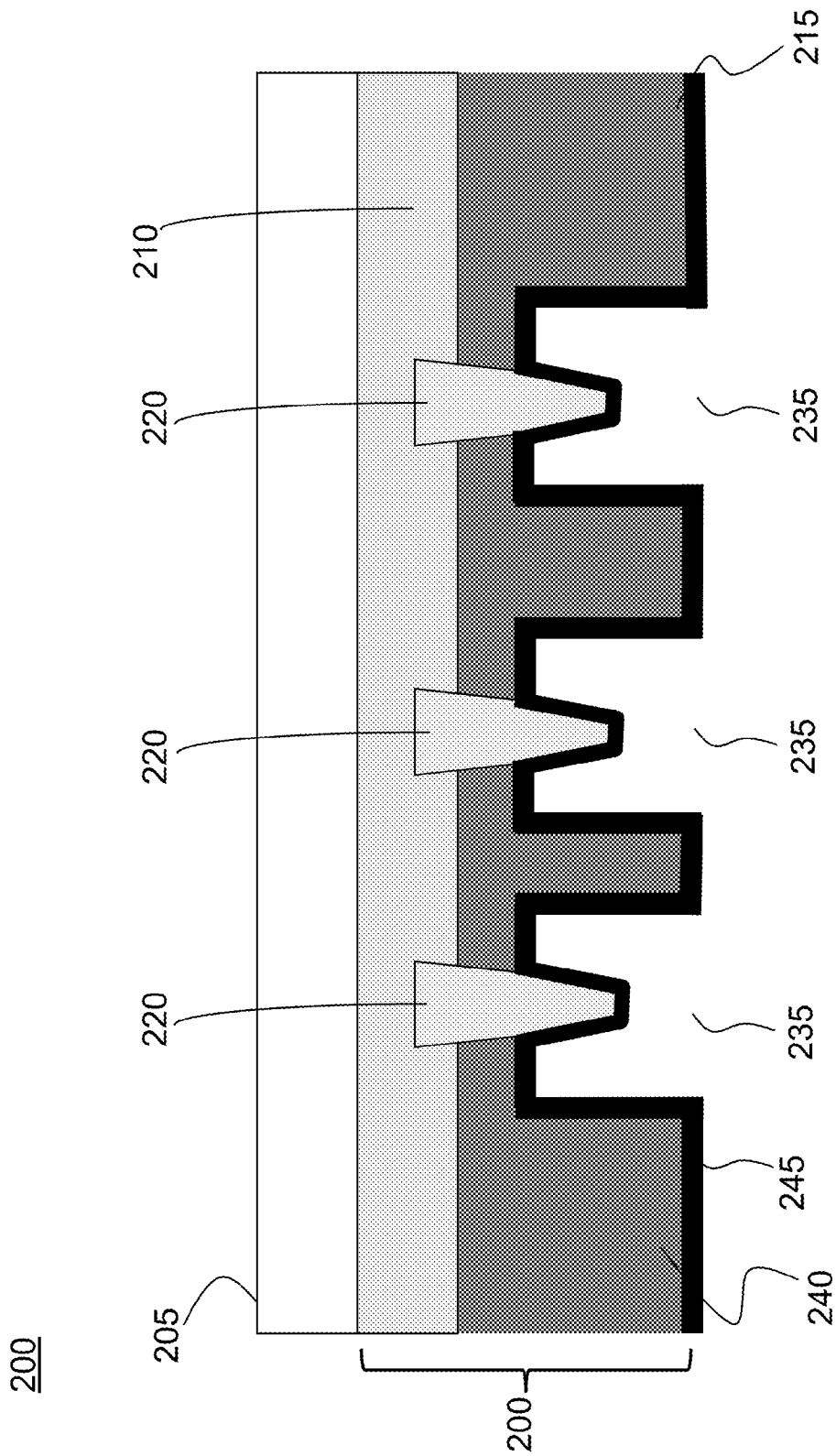

FIGS. 4-6 show a method of forming partial front side through silicon vias (TSVs) according to a second embodiment of the present invention. The method of forming partial front side TSVs according to this embodiment begins at FIG. 4 by obtaining a wafer 200 coupled to a wafer carrier 205. Wafer 200 includes a wafer front side 210, a wafer back side 215 and a plurality of partially etched TSVs 220, each extending from a portion of the front side through a portion of back side, terminating before reaching an end surface of the back side. In one embodiment, wafer 200 with the partially etched TSVs 220 can be formed in the same manner mentioned above for FIGS. 1-3.

In FIG. 5, regions 225 of back side 215 of wafer 200 are etched 230 to create openings 235 in the back side. Each opening 235 coincides with one of the plurality of TSVs 220, wherein each opening extends beyond a width of the coinciding TSV, and each opening is separated from an adjacent opening by an unetched portion of back side 215. In this manner, a trench portion 227 of each of the plurality of TSVs 220 is exposed in a respective opening 235. In this embodiment, like the one described with respect to FIGS. 1-3, etching 230 of regions 225 of back side 215 can include applying a plasma etch, a RIE, an anisotropic wet etch, an ICP etch, or an ECR etch.

In one embodiment, etching 230 of regions 225 of back side 215 can include a localized backside RIE with regions 225. In this manner, each of openings 235 formed during the etching align with one of the TSVs 220, encompassing each TSV by a predetermined amount. The use of the etching in this manner results in the formation of rim structures 240 on back side 215 of each of the chips on wafer 200 that encompasses the TSVs 220.

In FIG. 6, a metal layer 245 is deposited on back side 215 of wafer 200. Metal layer 245 can cover all of back side 215 including the etched regions of the back side including openings 235 and the exposed trench portions of each of TSVs 220. Deposition techniques described above with respect to FIGS. 1-3 can be used in this embodiment to deposit metal layer 245 on back side 215 of wafer 200. Note that the front side of the TSVs can have dielectrics and multilevel metallization. In one embodiment, a multilevel front side metallization can include aluminum (Al), Cu, etc. In another embodiment, the multilevel front side metallization can include a hybrid multilevel metallization of Cu and Al wires.

Advantages of the partial front side TSVs that are formed according to FIGS. 1-6 include eliminating poor reveal TSVs since etching occurs at the both the front side and back side of the wafer, ensuring that the TSVs are completely etched through the wafer and revealed. In addition, the partial front side TSVs formed according to FIGS. 1-6 cause an increase in mechanical strength to the wafers in comparison to wafers that have TSVs formed according to conventional approaches because of the remaining rim. Thus, resolving poor reveal of TSVs will result in a wafer that is less susceptible to cracking. Another improvement includes a thermal benefit to the wafer since there is better heat dissipation due to increased surface area. A further benefit includes a grounding advantage since the partial front side TSVs formed according to FIGS. 1-6 enable the devices in the integrated circuit chips to be closer to ground, thereby having lower inductance. Still other benefits are that the partially-etched front side TSVs formed according to FIGS. 1-6 are shallower, allowing for wider vias that can be etched faster, easier and with more control.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:
1. A method, comprising:
  obtaining a wafer having a front side, a back side and a plurality of partially etched and metalized through silicon vias (TSVs), wherein each partially etched and metalized TSV of the plurality of partially etched and metalized TSVs extends from a portion of the front side through a portion of the back side of the wafer and terminates before reaching an end surface of the back side of the wafer;

patterning and etching a region of the back side of the wafer to expose and reveal a portion of each partially etched and metalized TSV of the plurality of partially etched and metalized TSVs, wherein the patterning includes applying a mask on the back side of the wafer; and wherein the portion of each partially etched and metalized TSV of the plurality of partially etched and metalized TSVs includes a trench portion of each partially etched and metalized TSV of the plurality of partially etched and metalized TSVs, the trench portion being a portion of a sidewall of each partially etched and metalized TSV of the plurality of partially etched and metalized TSVs and depositing a metal layer on the back side of the wafer to form a back side metallization, the metal layer covering all of the back side of the wafer including the etched region of the back side of the wafer and the exposed portions of each partially etched and metalized TSV of the plurality of partially etched and metalized TSVs.

2. The method according to claim 1, further comprising thinning the back side of the wafer prior to the patterning and etching of the region of the back side of the wafer, wherein the thinning of back side of the wafer prevents exposure of the plurality of partially etched and metalized TSVs at the front side of the wafer.

3. The method according to claim 2, wherein the thinning of the back side of the wafer includes thinning the back side of the wafer without exposing a bottom surface of the plurality of partially etched and metalized TSVs at the back side of the wafer.

4. The method according to claim 1, wherein the patterning of a region of the back side of the wafer comprises using a lithographic mask to align features on the front side of the wafer.

5. The method according to claim 1, wherein the patterning of a region of the back side of the wafer comprises using a lithographic mask that is unaligned to features on the front side of the wafer and aligned to an edge, flat, and/or notch of the back side of the wafer.

6. The method according to claim 5, further comprising using a waffle mask on the back side of the wafer, wherein a resist covers a dicing channel region and only areas where the plurality partially etched and metalized TSVs at the front side of the wafer are opened.

7. The method according to claim 1, wherein the etching of the region of the back side of the wafer comprises etching an area of the back side of the wafer that encompasses each partially etched and metalized TSV of the plurality of partially etched and metalized TSVs.

8. The method according to claim 7, wherein the etching of the region of the back side of the wafer comprises applying a mask that is coincident with the area of the back side of the wafer that encompasses each partially etched and metalized TSV of the plurality of partially etched and metalized TSVs.

9. The method according to claim 1, wherein the etching of the region of the back side of the wafer comprises etching a plurality of openings through the back side of the wafer, each opening of the plurality of openings coinciding with one of the partially etched and metalized TSVs of the plurality of partially etched and metalized TSVs, wherein each opening of the plurality of openings extends beyond an area of the coinciding partially etched and metalized TSV, each opening separated from an adjacent opening by an unetched portion of the back side of the wafer.

10. The method according to claim 1, wherein the etching of the region of the back side of the wafer comprises applying a plasma etch, a reactive-ion etch (RIE), an anisotropic wet etch, an inductive coupling of RF power (ICP) etch, or an electron cyclotron resonance (ECR) etch.

11. The method according to claim 1, wherein the patterning and etching the region of the back side of the wafer includes patterning and etching the region of the back side of the wafer such that the region has a depth of approximately 18 microns.

12. The method according to claim 1, wherein the thinning the back side of the wafer includes thinning the back side of the wafer to a thickness of approximately 90 microns, and the patterning and etching the region of the back side of the wafer includes patterning and etching the region of the back side of the wafer such that the region has a depth of approximately 18 microns.

13. A method, comprising:

obtaining a wafer having a front side, a back side and a plurality of partially etched and metalized through silicon vias (TSVs), wherein each partially etched and metalized TSV of the plurality of partially etched and metalized TSVs extends from a portion of the front side through a portion of the back side of the wafer and terminates before reaching an end surface of the back side of the wafer;

thinning the back side of the wafer to prevent exposure of the plurality of partially etched and metalized TSVs at the front side of the wafer and exposure of a bottom surface of the plurality of partially etched and metalized TSVs at the front side of the wafer;

patterning and etching an opening in the back side of the wafer to expose and reveal a trench portion of each partially etched and metalized TSV of the plurality of partially etched and metalized TSVs, the trench portion including a portion of a sidewall of each partially etched and metalized TSV of the plurality of partially etched and metalized TSVs;

wherein the patterning includes applying a mask on the back side of the wafer; and depositing a metal layer on the back side of the wafer to form a back side metallization, the metal layer extending along a surface of the back side of the wafer including along the opening and the exposed trench portions of each partially etched and metalized TSV of the plurality of partially etched and metalized TSVs.

14. The method according to claim 13, wherein the etching of the opening comprises etching an area of the back side that encompasses each partially etched and metalized TSV of the plurality of partially etched and metalized TSVs.

15. The method according to claim 14, wherein the etching of the opening comprises applying a mask that aligns with the area of the back side of the wafer that encompasses each partially etched and metalized TSV of the plurality of partially etched and metalized TSVs.

16. The method according to claim 13, wherein the etching of the opening comprises etching a plurality of openings through the back side, each opening of the plurality of openings coinciding with one of the plurality of partially etched and metalized TSVs, wherein each opening of the plurality of openings extends beyond an area of the coinciding partially etched and metalized TSVs, each opening separated from an adjacent opening by an unetched portion of the back side of the wafer.

17. The method according to claim 13, wherein the patterning of a region of the back side of the wafer comprises using a lithographic mask to align features on the front side of the wafer.

18. The method according to claim 13, wherein the patterning of a region of the back side of the wafer comprises using a lithographic mask that is unaligned to features on the front side of the wafer and aligned to an edge, flat, and/or notch of the side of the wafer.

19. The method according to claim 18, further comprising using a waffle mask on the wafer backside, wherein a resist covers a dicing channel region and only areas where the plurality of partially etched and metalized TSVs at the front side of the wafer are opened.

* * * * *